(12) United States Patent
Gesley

(10) Patent No.: US 6,936,981 B2
(45) Date of Patent: Aug. 30, 2005

(54) RETARDING ELECTRON BEAMS IN MULTIPLE ELECTRON BEAM PATTERN GENERATION

(75) Inventor: Mark Alan Gesley, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 10/291,292

(22) Filed: Nov. 8, 2002

(65) Prior Publication Data

US 2004/0090194 A1 May 13, 2004

(51) Int. Cl.[7] .......................... H01J 25/00; H01J 37/28; H01J 37/30
(52) U.S. Cl. ...................... 315/500; 315/506; 250/310; 250/492.24
(58) Field of Search ................................ 315/500, 506, 315/366; 250/310, 492.24, 398, 492.2, 311, 306, 307, 397, 492

(56) References Cited

U.S. PATENT DOCUMENTS

| | | | | |
|---|---|---|---|---|
| 4,713,543 A | * | 12/1987 | Feuerbaum et al. ......... | 250/310 |
| 5,386,221 A | * | 1/1995 | Allen et al. .................. | 347/239 |
| 5,691,541 A | | 11/1997 | Ceglio et al. ................ | 250/492 |
| 5,789,748 A | * | 8/1998 | Liu et al. ..................... | 250/310 |
| 6,014,200 A | | 1/2000 | McCoy et al. ................ | 355/53 |
| 6,215,128 B1 | * | 4/2001 | Mankos et al. ......... | 250/492.24 |
| 6,444,981 B1 | * | 9/2002 | Todokoro et al. ........... | 250/310 |
| 6,448,568 B1 | | 9/2002 | Allen et al. ............ | 250/492.24 |
| 6,534,766 B2 | * | 3/2003 | Abe et al. .................... | 250/307 |
| 6,538,256 B1 | * | 3/2003 | Mankos et al. ......... | 250/492.24 |
| 2002/0142496 A1 | | 10/2002 | Hiroshi et al. | |
| 2003/0048427 A1 | | 3/2003 | Fernandez et al. ............ | 355/53 |

FOREIGN PATENT DOCUMENTS

| | | |
|---|---|---|
| EP | 0451907 A1 | 10/1991 |
| EP | 0794552 A3 | 9/1997 |
| EP | 0794552 A2 | 9/1997 |
| WO | WO9848443 | 10/1998 |
| WO | WO9903016 | 1/1999 |
| WO | WO9903022 | 1/1999 |
| WO | WO9947978 | 9/1999 |
| WO | WO 0213226 A2 | 2/2002 |

OTHER PUBLICATIONS

Kong, S.H. et al., Cesium telluride photocathodes, J. Appl. Phys., vol. 77 No. 11, Jun. 1, 1995, pp. 6031–6038.

Dinh, L.N. et al., Synthesis and characterization of Si/Cs/O nanocluster thin films with negative electron affinity, Phys. Rev. B., vol. 59 No. 23, Jun. 15, 1999, pp. 513–522.

Zlatkin A et al: "Functional scanning electron microscope of low beam energy with integrated electron optical system for nanolithography", Microelectronic Engineering, May 1999, pp. 213–217, vol. 46, No. 1–4, Elsevier Publishers BV, Amsterdam, Netherlands.

Khursheed A et al: "Permanent magnet objective lenses for multicolumn electron–beam systems", Review of scientific instruments, Apr. 2001, pp. 2106–2109, vol. 72, No. 4, American Institute of Physics, New York, U.S.

(Continued)

Primary Examiner—Tuyet Vo
Assistant Examiner—Chuc Tran
(74) Attorney, Agent, or Firm—Janah & Associates

(57) ABSTRACT

A multiple electron beam pattern generator includes a multiple electron beam source to generate a plurality of electron beams that are modulated according to a pattern. An anode accelerates the electron beams, and then a beam retarding system generates a retarding electric potential about the electron beams to decrease the kinetic energy of the electron beams substantially near a substrate. A beam scanner scans the electron beams across the substrate. A substrate support supports the substrate, and a pattern is generated on the substrate.

28 Claims, 7 Drawing Sheets

OTHER PUBLICATIONS

Yau Y W et al: "Generation and application of finely focused beams of low-energy electrons", J. Vac. Sci. Technol. (USA), Nov./Dec 1981, pp. 1048–1052, vol. 19, No. 4, 1981, Journal of Vacuum Science and Technology, American Vacuum Society, USA.

Liqun Han et al: "Performance investigation of Coulomb interaction–limited high throughput electron beam lithography based on empirical modeling", J. Vac. Sci. Technol. B. Nov./Dec. 1998, pp. 3215–3220, vol. 16, No. 6, Journal of vacuum science & technology B, AIP for American Vacuum Society, USA.

* cited by examiner

RETARDING ELECTRON BEAMS IN MULTIPLE ELECTRON BEAM PATTERN GENERATION

GOVERNMENT SUPPORT

This invention was made with Government support under Contract Number N66001-99C-8624 awarded by the Department of the Navy. The Government has certain rights in the invention.

BACKGROUND

Embodiments of the present invention relate to the generation of a pattern on a substrate using electron beams.

A conventional electron beam pattern generator typically comprises an electron beam column in which a single electron beam is generated, modulated, and directed onto a substrate to expose an electron-sensitive resist material on the substrate. A substrate support is used to support and move the substrate. An electron beam source generates the electron beam. A beam modulator modulates the intensity of the electron beam. Beam optics are used to focus the electron beam. A beam scanner is used to scan the electron beam across the substrate.

One problem with conventional pattern generators is that these systems typically use a single beam and, consequently, generate a pattern at relatively slow speeds because pixels are sequential exposed on the substrate in series. The exposure rate of single beam systems is further limited by the total beam current. As the total beam current is increased, electron to electron interactions cause excessive proximity errors by undesirably exposing regions of the substrate that neighbor target regions.

Multiple electron beam pattern generators use a plurality of electron beams to generate an electron beam pattern on a substrate and, consequently, can generally operate with better resolution and at higher speeds than single electron beam pattern generators. The multiple electron beams are accelerated to a high velocity at which they can be drawn from the electron source as separate and well-defined beams. However, the multiplicity and close spacing of the individual electron beams also result in distortions of the electron beams that limit the quality of the pattern formed on the substrate. For example, as the electron beams propagate towards the substrate, space charge interactions occur between the electrons in neighboring electron beams, blurring and distorting the cross-sectional shape of the electron beams. As the total beam current is increased, electron to electron interactions limit beam resolution, and hence upper limits are placed on beam current and exposure rate to ensure adequate optical resolution and critical dimension control.

Also, as the electron beams impinge on the substrate, the degree of exposure of a region on the substrate by one electron beam is undesirably affected by neighboring electron beams that simultaneously impinge on the substrate. Undesirable exposure can result from electrons from individual beams scattering upon impact and also due to localized heating of the substrate from the energy of multiple beams. In addition, cross-over regions where the multiple electron beams cross-over one another, such as during focusing of the beams, can result in beam to beam interactions that further reduce the resolution of the beams and increase beam error functions.

It is desirable to generate a pattern on a substrate using multiple electron beams having reduced beam interactions. It is further desirable to have a system capable of generating a pattern with multiple electron beams that exhibits reduced scattering or localized heating effects. It is also desirable to have a multiple electron beam pattern generating system capable of providing high exposure rate with good resolution.

SUMMARY

A multiple electron beam pattern generator comprises a multiple electron beam source to generate a plurality of electron beams that are modulated according to a pattern. An anode accelerates the electron beams and beam optics focus the electron beams. A beam retarding system generates a retarding electric potential about the electron beams to decrease the kinetic energy of the electron beams substantially near a substrate. A beam scanner scans the electron beams across the substrate. A substrate support supports the substrate so that a pattern may be generated on the substrate.

In another version, the multiple electron beam pattern generator has a multiple electron beam source to generate a plurality of electron beams that are modulated according to a pattern and directed along a path. A substrate support supports the substrate. An anode is provided, as well as an anode voltage supply to apply a first electric potential to the anode to accelerate the electron beams. Beam optics focus the electron beams. A retarding electrode is provided between the anode and the substrate support along the path of the electron beams, and a retarding voltage supply applies a second electric potential to the retarding electrode, the second electric potential being lower than the first electric potential. A beam scanner scans the electron beams across the substrate, and a pattern is generated on the substrate.

A method of generating an electron beam pattern on a substrate comprises generating a plurality of electron beams that are modulated according to a pattern. The electron beams are accelerated and focused. A retarding electric potential is maintained about the electron beams to decrease the kinetic energy of the electron beams substantially near a substrate. The electron beams are scanned across the substrate, and a pattern is generated on the substrate.

In another version, the multiple electron beam pattern generator comprises a multiple electron beam source to generate a plurality of electron beams that are modulated according to a grayscale intensity pattern. The beam retarding system retards the electron beams from a kinetic energy in the range of from about 10 keV to about 100 keV to a kinetic energy in the range of from about 100 eV to about 5 keV substantially near the substrate. The beam scanner scans the electron beams across the substrate in an interlaced scan pattern. In this version, the substrate support supports and electrically isolates the substrate, and transports the substrate in coordination with the scanning of the electron beams by the beam scanner, to generate a pattern on the substrate.

In yet another version, the multiple electron beam pattern generator has a beam retarding modification kit that includes (a) a potential decreasing element placed about the substrate support, and (b) a voltage supply to apply a voltage to the potential decreasing element to generate a retarding electric field about the electron beams to decrease the kinetic energy of the electron beams substantially near the substrate.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

Figure 1:
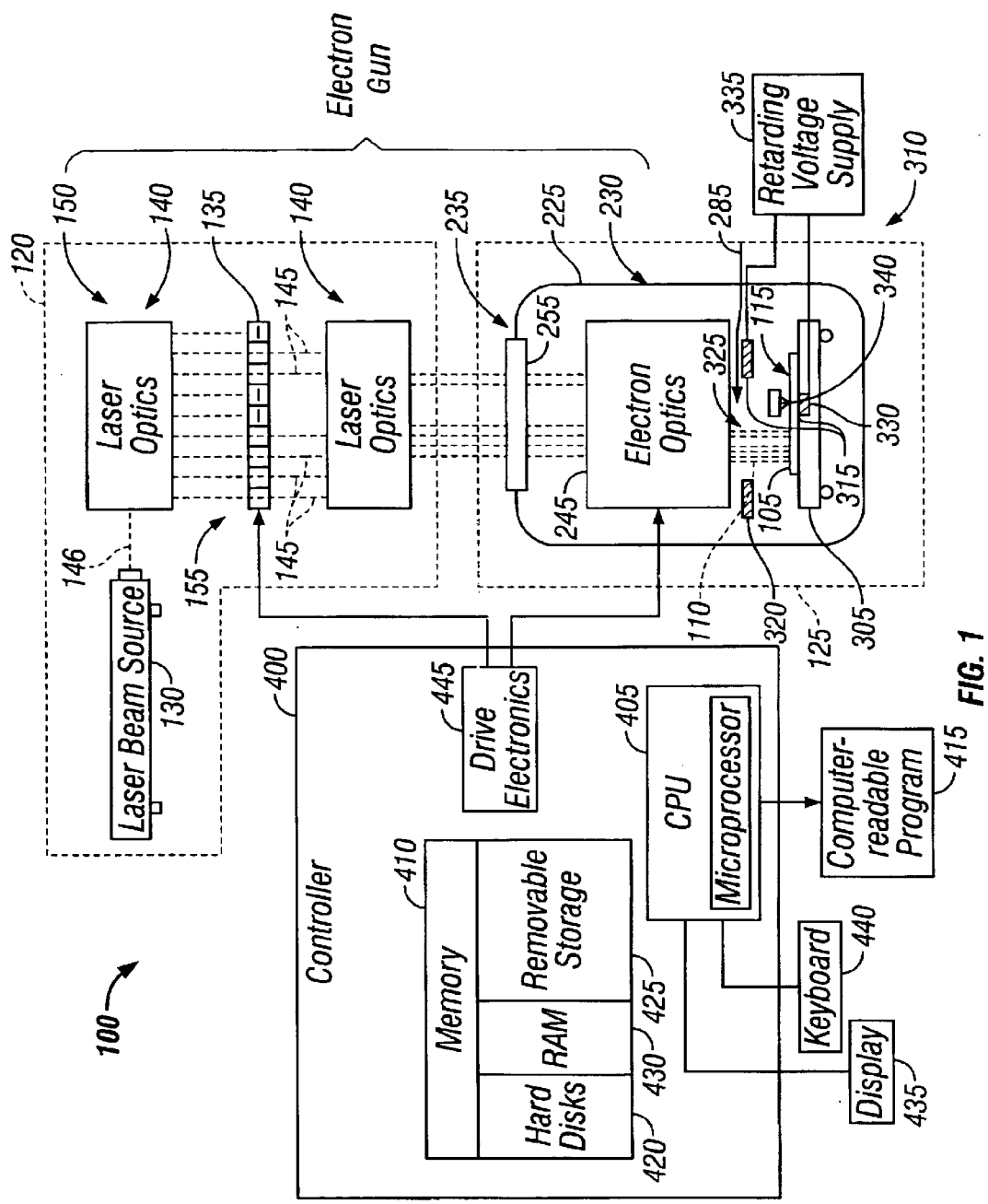
FIG. 1 is a schematic diagram of an embodiment of a multiple electron beam pattern generator having a laser beam section, an electron beam section, an electron beam retarding system and a controller.

Embodiments of a multiple electron beam pattern generator 100 are used to generate a pattern on a substrate 105 using multiple electron beams 110, as illustrated in FIG. 1. The illustrative apparatus provided herein should not be used to limit the scope of the invention, and the invention encompasses equivalent or alternative versions, as would be apparent to one of ordinary skill in the art. The multiple electron beam pattern generator 100 is suitable for generating a pattern on a substrate 105 that comprises one or more dielectric, semiconducting, or conducting materials, including, for example, metal, polymer, or ceramic materials, which are formed on the substrate 105. The substrate 105 may comprise, for example, a blank mask comprising a transparent plate of glass or quartz, that is coated with an electron-sensitive resist layer 115 (as shown) and a metal layer; a silicon wafer; a compound semiconductor wafer; a printed circuit board (PCB); or a multichip module (MCM). The substrate 105 comprises an electron-sensitive resist layer 115 having a thickness of from about 20 nm to about 1 $\mu$m, or even from about 50 to about 500 nm. For example, the resist layer 115 may be a multi-component resist layer having a top imaging layer with a thickness of from about 20 to about 150 nm. The pattern imprinted on the resist layer 115 of the substrate 105 may be, for example, a latent image of a mask used in the fabrication of an integrated circuit (IC), display, or printed circuit board (PCB), or a circuit layout of an IC, display, or PCB. For the multi-component resist layer, the latent image can be transferred into lower layers, which themselves are used to further etch the pattern into the substrate 105. For example, one of the lower layers may be a mask absorber, wafer, metal, or dielectric layer. After exposure of a mask to the electron beams 110, the exposed resist layer 115 is developed to form the pattern on the mask. After generation of the pattern on the mask, IC, display, or PCB, the substrate materials are etched to form features such as a stencil mask, electrically interconnecting wiring or vias, or active or passive devices, such as for example, resistors, capacitors, diodes, and transistors. The features may be shaped as, for example, lines, plugs, cavities, channels, holes and trenches.

Figure 2:
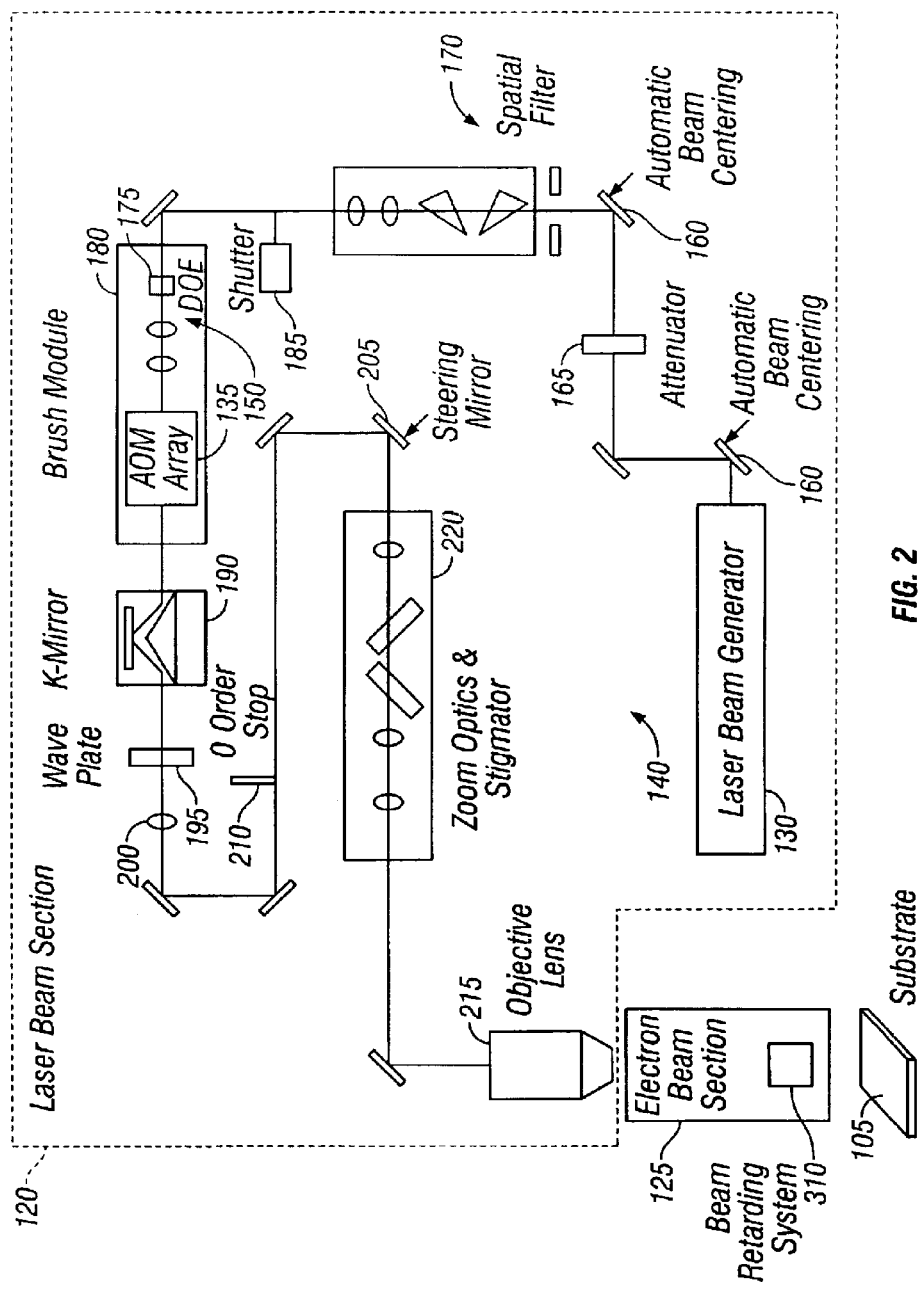
FIG. 2 is a schematic diagram of a laser beam section of the multiple electron beam pattern generator of FIG. 1.

In one version, the multiple electron beam pattern generator 100 includes a laser beam section 120 coupled to an electron beam section 125, as shown in FIG. 1. The laser beam section 120, as illustrated in FIG. 2, includes a laser beam generator 130, beam modulator 135, and laser optics 140. The laser beam generator 130 may be a deep ultraviolet (DUV) continuous-wave (CW) laser source in the wavelength range of from about 248 to about 266 nm. In one embodiment, the laser beam generator 130 is a 257 nm argon-ion laser source. In operation, a laser beam 144 is generated by the laser beam generator 130 and split into a plurality of individual laser beams 145 by a beam splitter 150. The beam splitter 150 may comprise, for example, a diffractive optical element, such as a diffraction grating, or a group of one-way mirrors. Typically, the multiple laser beams 145 form an array 155, as shown. The array 155 of laser beams 145 enters the beam modulator 135, where the intensity level of each of the laser beams 145 in the array 155 is individually modulated. For example, the beam modulator 135 may comprise an array of acousto-optic modulators (AOMs), which switch the laser beams 145 on or off by acoustically diffracting the laser beams 145 in response to an RF signal, or set the transmitted photon flux of each individual beam to a predetermined intermediate value. In one embodiment, the laser beam 145 is split into an array 155 of 32 beams by the beam splitter 150 and an equivalent number of beam modulator elements (such as 32 AOMs) are provided. In an AOM array, the modulation of the photon intensity is achieved by applying RF power to the individual AOM channels. Applying different levels of RF power can be used for fine modulation of the laser intensity. In another embodiment, the beam modulator 135 comprises an array of spatial light modulators (SLM) that is adapted to modulate the intensities and spatial extent of the laser beams 145. The SLM array can also serve as the beam splitter 150 or a part of the laser optics 140. The spatial light modulator may comprise a micromechanical diffracting device, cantilevered beam, or deformable mirror array. The SLM array can be advantageous because it can typically modulate a larger number of laser beams 145, such as from about 100 to about 10,000 laser beams 145. A grayscale comprising multiple gray levels and a multiple pass writing strategy may be used. Furthermore, an additional beam modulator (not shown) may be inserted in the optical system upstream of the splitter 150 to act as a fast auxiliary blanker. This additional beam modulator may be used during a scan retrace step for additional modulation. In one illustrative embodiment, a 300 MHz carrier frequency is used to diffract the laser beams 145 with an approximately 10 nsec pixel on-time.

The individually modulated laser beams 145, after passing through the beam modulator 135, are demagnified by the laser optics 140. The laser optics 140 may include optical light lenses focused on a desired plane of the electron beam section 125. The laser beam 145 from the laser beam generator 130 may also be actively controlled by automatic beam centering mirrors 160 so that alignment to the optical train, both in position and angle, is maintained. An attenuator 165, which may comprise a combination polarization rotating element and polarizing beam splitter, adjusts the laser power to a range suitable for operation of the system while allowing the laser beam generator 130 to operate in a power range optimized for reliability and stability. A spatial filter 170 can remove undesirable sections of the laser beam's intensity profile. Anamorphic relay optics may be provided to create a round beam from the laser light exiting this aperture and relay it to the beam splitter 150 comprising a diffractive optical element (DOE) 175 inside a brush module 180. The DOE 175 in this exemplary embodiment is a grating that produces a plurality of laser beams 145. For example, the DOE 175 may produce 32 laser beams 145. The laser beams 145 are focused by the lenses inside the brush module 180 to a region in the beam modulator 135.

A mechanical shutter 185 before the brush module 180 is used to block light from reaching the electron beam section 125 when the multiple electron beam pattern generator 100 is not exposing the substrate 105. A K-mirror 190 allows for rotational adjustment of the linear array of laser beams 145 exiting the additional beam modulator. A wave plate 195 aligns the polarization of the beams 145 for optimal focusing through a subsequent birefringent photocathode substrate that is described below. A lens element 200 after the wave plate 195 focuses the laser beam array 155 onto an afocal spot on a steering mirror 205. Before reaching the steering mirror 205, any zero-order (undiffracted) light from the beam modulator 135 is blocked by a zero-order beam stop 210. The steering mirror 205 allows for small positional adjustment of the spot array at the final image plane of an objective lens 215. The zoom optics and stigmator 220 relay the focal spot into the pupil of the objective lens 215. Tilted plates inside the zoom optics and stigmator 220 provide adjustment capability to ensure that the focus of the spots onto the electron beam section 125 occurs in the same plane whether measured along the direction of the array of spots or perpendicular to it. Movable lenses within the zoom optics and stigmator 220 allow for slight magnification adjustment of the laser beam array 155.

Below the laser beam section 120, the electron beam section 125 converts the laser beam image generated by the laser beam section 120 into a corresponding electron beam image. The electron beam section 125 may comprise a vacuum column 225 containing a vacuum environment in which electron beams 110 can be generated to expose the substrate 105 to the electron beam image. The vacuum column 225 comprises walls 230 that are substantially vacuum-tight and are typically made of a material such as aluminum. One or more vacuum pumps (not shown) are provided to evacuate the vacuum column 225 to create and maintain the vacuum environment. In one embodiment, the vacuum pumps provide a first vacuum environment at the top portion of the vacuum column 225, and a second vacuum environment which may have a different vacuum pressure at the bottom portion of the vacuum column 225. For example, the first vacuum environment may be at a gas pressure of about $10^{-9}$ Torr and the second vacuum environment may be at a gas pressure of about $10^{-6}$ Torr. A pressure barrier may also be provided between the vacuum environments to maintain the pressure difference.

The electron beam section 125 includes a multiple electron beam source 235, an anode 240, and electron optics 245. In one embodiment, the multiple electron beam source 235, the anode 240 and a portion or all of the electron optics 245 form an electron gun whose elements cooperate to extract, accelerate, and focus the electron beams 110. In the operation of the illustrated version of FIG. 1, the laser optics 140 focus the laser beam array 155 exiting the beam modulator 135 onto a photoemissive layer 250 of a photocathode 255 of the multiple electron beam source 235. The photocathode 255 receives the laser beam image and generates the corresponding electron beam image out of the multiple electron beams 110. The photocathode 255 may additionally comprise a substrate that is transparent to the laser beams 145 as they pass through the substrate to the photoemissive layer 250. In operation, photons absorbed in the photocathode 255 excite electrons above the energy level of the vacuum, and a portion of the electrons that are sufficiently excited are emitted into the vacuum environment. In one embodiment, the photocathode 255 has a photoyield of at least about 20 nA/mW.

Examples of suitable photocathodes 255 are CsBr (cesium bromide) photocathodes, $Cs_XTe_Y$ (cesium telluride, where X and Y are rational numbers) photocathodes, CsMo photocathodes, Mg (magnesium) photocathodes, negative electron affinity photocathodes, based for example on cesiated GaAs (gallium arsenide), cesiated GaN (gallium nitride) photocathodes, and silicon-cesium oxide nanoclusters and possibly gold with a covering of hydrocarbons. The cesium bromide and cesium telluride photocathodes include a photoemissive layer of cesium bromide and cesium telluride, respectively. Cesium bromide and cesium telluride ($Cs_2Te$) are compound semiconductors with bandgaps in the range of from about 3 to about 5 eV. For example, they can yield a high quantum efficiency (about 10%) when irradiated with deep ultraviolet light having wavelengths of from about 198 to about 365 nm, and produce electrons having an energy spread of from about 1 to about 3 eV. In typical operation, a laser beam 145 in the wavelength range of from about 198 to about 365 nm can be used to illuminate the CsBr or $Cs_2Te$ photocathode. Certain embodiments may also include a cesium bromide (CsBr) layer applied to the top of a photocathode structure comprising oriented sapphire and a conducting Mo layer. For example, the CsBr layer may have a thickness of from about 5 to about 20 nm.

Figure 3:
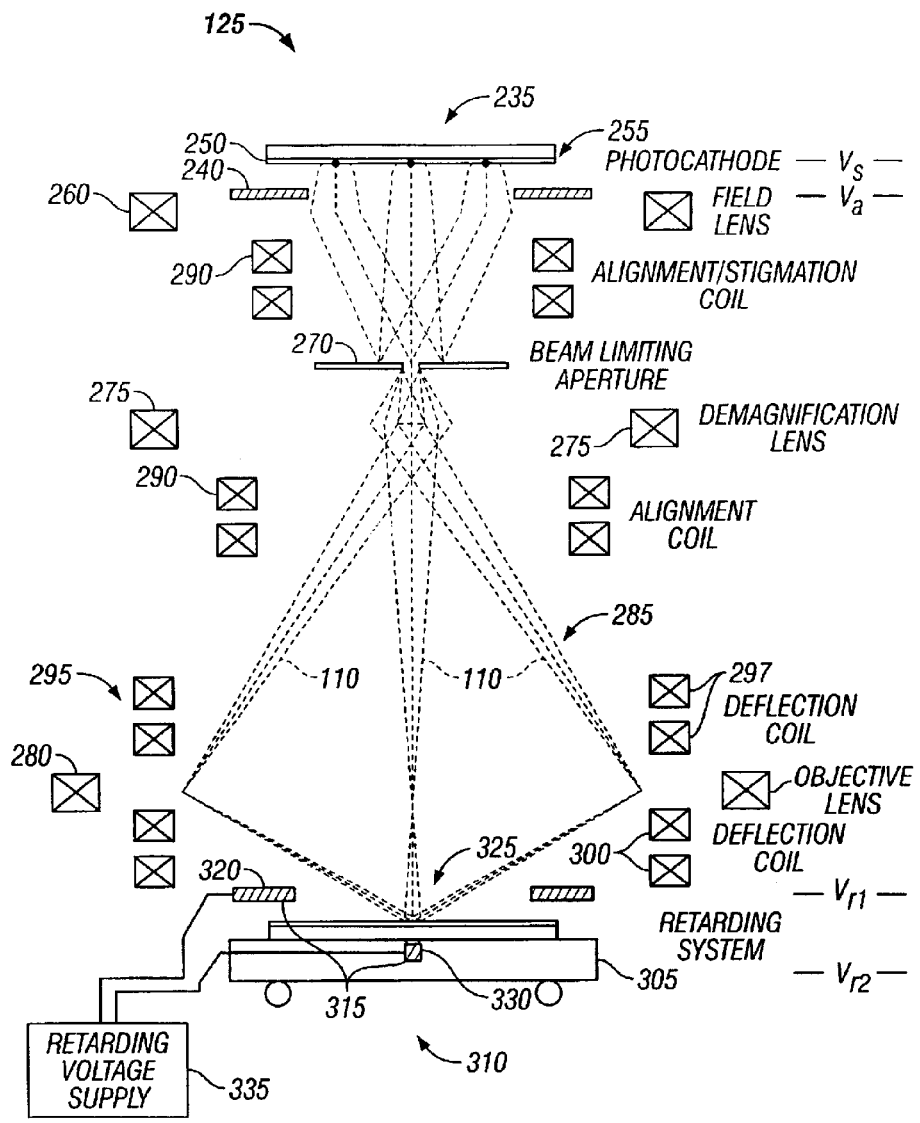
FIG. 3 is a sectional side view of an electron beam section of the multiple electron beam pattern generator of FIG. 1, the electron beam section comprising a multiple electron beam source, electron optics, beam retarding system, and beam scanner.

Exemplary electron optics 245 are shown in greater detail in FIG. 3. The photocathode 255 forms an extraction field between itself and the anode 240 to draw electron beams 110 from the photocathode 255 and accelerate the electron beams 110 toward the substrate 105. For example, the extraction field may have a strength of from about 5 to about 10 kV/mm. The electrons are accelerated to an initial energy level to draw the electrons from the multiple electron beam source 235 and form the electrons into multiple defined electron beams 110. The extraction energy level is selected to be sufficiently high to substantially prevent interactions between the electron beams 110. When the electron beams 110 are moving vertically at a higher velocity, lateral interactions between the electron beams 110 are typically less significant than when the electron beams 110 are moving at lower velocities. In one embodiment, the electron beams 110 have varying individual widths throughout the electron optics 245 with an ultimate resolution of from about 10 to about 100 nanometers. When a voltage is applied between the photocathode 255 and the anode 240, the electrons are accelerated and focused by the electron optics 245 to transfer the multiple laser beam image 166 at the photocathode 255 to a multiple electron beam image 111 at the substrate 105. In one embodiment, the photocathode 255 is biased at about −50 kV, with respect to a grounded anode 240 that is separated from the photocathode 255 by an accelerating gap. The anode 240 is typically a planar metallic electrode with an aperture in the center.

Alternatively to the photocathode version, the electron beam source 235 may comprise an array of controlled sized apertures illuminated by an electron gun to generate electron beams 110. The electron gun may comprise, for example, a LaB$_6$ or thermal field emission source to generate electrons. One or more individually addressable electrodes are provided about each of the apertures to draw the electron beams 110 from the electron gun and individually modulate the passage of each electron beam 110. The aperture array may further comprise one or more extraction and focusing electrodes adapted to extract electron beams 110 from the controlled apertures.

The multiple electron beam pattern generator 100 further comprises electron optics 245 to shape the electron beams 110, such as to focus, demagnify, stigmate, or align the electron beams 110. Optionally, an electron field lens 260 is used to reduce distortion and aberrations as the multiple electron beam image is transferred to demagnification lenses 275 that follow. Further details of exemplary electron optics are shown in commonly-assigned U.S. Pat. No. 6,215,128 by Mankos et al., titled "A Compact Photoemission Source, Field and Objective Lens Arrangement for High Throughput Electron Beam Lithography," filed on Mar. 18, 1999, which is hereby incorporated by reference in its entirety. The field lens 260 collimates the electrons exiting the accelerating region above the anode 240 and converges the electron beams 110 to at least one crossover, such as in the plane of a beam-limiting aperture 270. As shown, the field lens 260 generates a magnetic field, but it can alternatively comprise an electrostatic lens assembly to generate an electric field. The image created by the field lens 260 is then subsequently demagnified by the demagnification and objective magnetic lenses 275, 280 to form an array 285 of focused electron beams 110. A set of alignment and stigmation coils 290 is used to center and stigmate the electron beam array 285 in the beam-limiting aperture 270 and in the objective lens 280.

In one embodiment, a beam scanner 295 comprising a set of magnetic beam deflection coils 297 is used to scan the array 285 of individually modulated electron beams 110 across the substrate 105. Another set of magnetic deflection coils 300 performs dynamic stigmation and focus as the electron beam array 285 is scanned across a field of the substrate 105. This allows dynamic stigmation, focus, or x/y deflection corrections to be applied to different parts of the scan field.

The electron beam path traversed by the electron beams 110 can be curvilinear. The orientation of the laser beam section 120 to the electron beam section 125 may be adapted to convenience, for example such that the configuration is suitable to the overall exterior packaging of the multiple electron beam pattern generator 100. In one embodiment, the components of the electron beam section 215, such as the multiple electron beam source 235, anode 240, and beam scanner 295, are coaxially aligned in a column above the substrate 105.

The multiple electron beam pattern generator 100 further comprises a substrate support 305 capable of supporting the substrate 105. The support 305 may comprise an electrostatic chuck (not shown) capable of holding the substrate 105 against the support 305, or alternatively a gravity-held kinematic mount (not shown). The multiple electron beam pattern generator 100 may also comprise support motors capable of moving the support 305 to precisely position the substrate 105 in relation to the electron optics 245 or to move the substrate 105 to translate the electron beams 110 across the substrate 105. For example, the support motors may comprise electric motors that transport the support 305 in the 'x' and 'y' directions along an x-y plane parallel to the substrate surface, rotate the support 305, elevate or lower the support 305, or tilt the support 305. The multiple electron beam pattern generator 100 may further comprise support position sensors capable of precisely determining the position of the support 305. For example, the support position sensors may operate in conjunction with a substrate height sensor, which reflects a light beam from the substrate 105 and detects the intensity of the reflected beam to precisely determine the actual distance between the substrate 105 and a focal plane of the electron beams 110. In one embodiment, the focal plane of the electron beams 110 is by a vertical position of a fiducial mark locator 340.

As the array 285 of electron beams 110 approaches the substrate 105, the electron beams 110 are retarded by a beam retarding system 310 that applies retarding electric potential about the electron beams 110 to decrease the kinetic energy of the electron beams 110 substantially near the substrate 105. The retarding electrical potential is an electrical potential that is lower than the electric potential maintained at a component, such as the anode 240, that precedes the location of application of the retarding potential along the path traversed by the electron beams 110. The retarding electrical potential decreases the kinetic energy of the electron beams 110 to a level that is sufficiently low that the electrons are in a range of desirable landing energies at the time they strike the electron-sensitive resist layer 115 of the substrate 105. The correspondingly lower landing velocities of the electron beams 110 provide better exposure efficiency since lower beam currents can be used while maintaining desirably high resolution levels. The resolution of the exposure pattern formed in the resist layer 115 of the substrate 105 may be similar to conventional higher energy exposures because aberrations due to the retarding process scale down with the decreased final beam energy, and because the electrons that are at a much lower energy level tend to travel shorter distances both through the thickness of the resist layer 115 and sideways into adjacent pixel regions. Also, the lower electron beam current exposes the resist layer 115 more efficiently because the electrons with lower kinetic energies have a larger effective cross-section within the resist layer 115 of the substrate 105. Higher energy electrons tend to penetrate deeper into the resist layer 115 and are delivered in larger doses due to their smaller effective cross-section. Additionally, the lower electron current decreases the amount of space charge interaction between the electron beams 110 to improve the resolution of the electron beams 110 and the quality of pattern generation. Typically, the electron beams 110 are decelerated from their peak kinetic energy, which occurs after acceleration beyond the anode 240. In one embodiment, it is desirable to retard the electron beams 110 to a landing energy of from about 100 eV to about 5 keV. Furthermore, for a multi-component resist layer having a top imaging layer with a thickness of from about 20 to about 150 nm, the proximity effects due to sideways exposure into adjacent pixel regions are reduced.

In one version, as shown in FIG. 3, the electron beam retarding system 310 comprises a potential decreasing element 315 held at a lower electric potential than the anode 240, such as a negative potential relative to the potential of the anode, and is located between the anode 240 and the substrate support 305, about or inside the substrate support 305, or below the substrate support 305. The potential decreasing element 315 creates a region of low electric potential above the substrate support 305 such that the electron beams 110 are decelerated. For example, if the multiple electron beam source 235, anode 240, and potential decreasing element 315 are adapted to be at electric potentials $-V_B$, $V_A$, and $-V_B+V_L$, respectively, then $V_L$ may be from about 0.1 to about 5 kV. In one embodiment, the anode 240 is grounded and $V_A$ is approximately zero. Alternatively or in addition to the range of $V_L$ provided above, the ratio of $V_B$ to $V_L$ may preferably be from about 10 to about 100. In one embodiment, $V_L$ is from about 0.5 kV to about 3 kV.

By retarding the electron beams 110, beam-to-beam interactions, scattering, and localized heating effects can be reduced while improving one or both of exposure rate and resolution. The electron beam retarding system 310 acts upon electrons emerging from objective magnetic lenses 275, 280 of the column 225, the electrons having a high beam energy $E_B$, such as in the range of from about 10 to about 100 keV, but impinging on the substrate 105 with a retarded landing energy $E_L$, such as from about 0.1 to about 5 keV.

For example, the potential decreasing element 315 may be a retarding electrode 320 near the substrate support 305. The retarding electrode 320 may comprise a laterally extended conductor having an aperture 325 therein to allow passage of the electron beams 110 through the aperture 325. The aperture 325 in the retarding electrode 320 may have a diameter of from about 10 to about 1000 times the full-width-half-maximum (FWHM) diameter of the electron beams 110 to suitably allow passage of the electron beams 110 therethrough while also effectively retarding the electron beams 110.

In one version, the substrate support 305 is adapted to apply a retarding potential to the substrate 105 via a potential decreasing element 315 in the substrate support 305. For example, the substrate support 305 may comprise a retarding electrode 330 that connects to a retarding voltage supply 335 and makes electrical contact with the substrate 105 to maintain the substrate 105 at a desirable electric potential. In one embodiment, the retarding electrode 330 is a conductive pin that passes through a portion of the substrate support 305 and contacts the underside or topside of the substrate 105. The substrate support 305 can be adapted so that the retarding electrode 330 and the substrate 105 are electrically isolated. For example, if the vacuum column 225 is grounded, the substrate 105 should be electrically floated from the vacuum column 225 to ensure that the substrate 105 is held at the appropriate retarding potential by the retarding voltage supply 335. This potential decreasing element 315 in the substrate support 305 may be used by itself or in combination with the potential decreasing element 315 between the anode 240 and the substrate support 305, about the substrate support 305, or below the substrate support 305.

When a plurality of potential decreasing elements 315 are used, the retarding potential may be applied in stages. For example, a first potential decreasing element 320 above the substrate support 305 may be maintained at a first retarding voltage $V_{r1}$, and a second potential decreasing element 330 in the substrate support 305 may be at a second retarding voltage $V_{r2}$ that is lower than the first retarding voltage $V_{r1}$, as shown in FIG. 3. This generates two successive potential drop regions that allow the retarding potential to be more gradually stepped, thereby lessening deleterious electric field effects that may be caused by a large potential difference between two adjacent conductors. $V_{r1}$ can be further subdivided if the first potential decreasing element 320 comprises a plurality of electrodes, such as an electrostatic Einzel lens, which may be symmetric or asymmetric.

Figure 4:
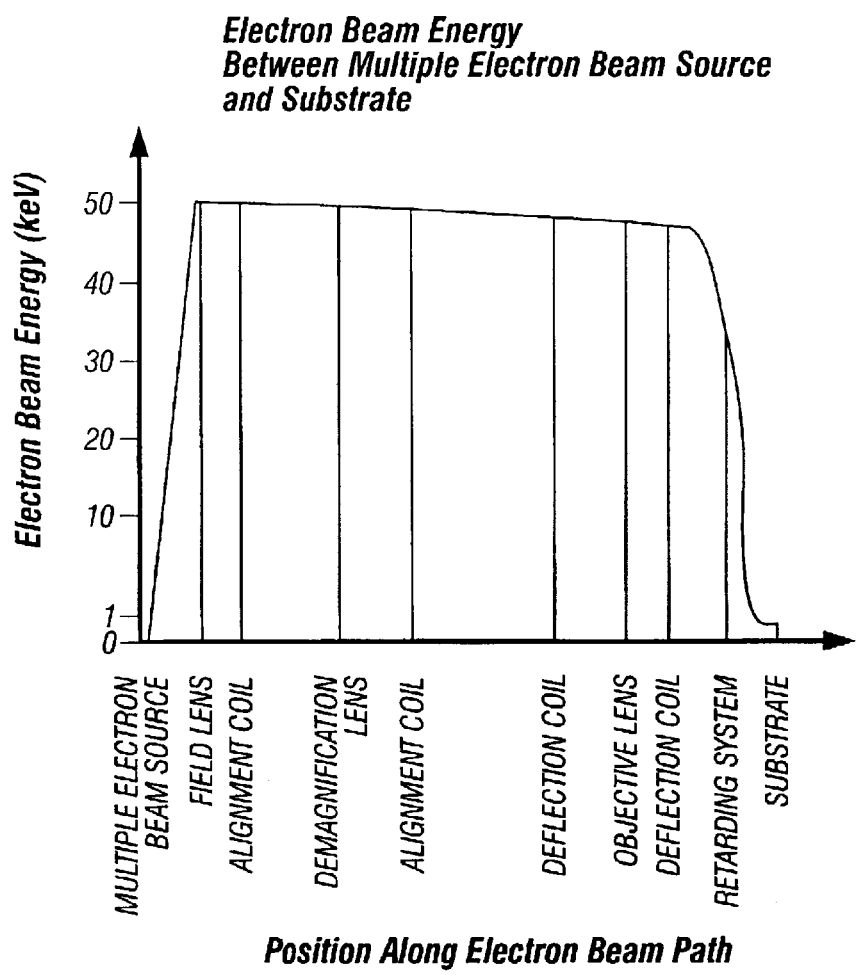
FIG. 4 is a plot of the energy of the electron beams as the electron beam traverses a path between the multiple electron beam source and the substrate of FIG. 3, the plot showing the accelerating and subsequent retarding of the electron beams.

In one exemplary embodiment, illustrated by the plot of FIG. 4, the electron beams 110 are accelerated in the vacuum column 225 to an energy of about 50 keV before being retarded. In this example, the multiple electron beam source 235 is held at a potential of about −50 kV, other optional optical components below the multiple electron beam source 235 may be at potentials higher than −50 kV, and one optical component farther down, such as the anode 240, may be at a potential of about 0 V. A retarding potential is applied to the potential decreasing element 315 to decelerate the electron beams 110 from an energy of about 50 keV to an energy of about 1 keV. For example, the substrate support 305 may be held at a potential of about −49 kV by the potential decreasing element 315 in the substrate support 305 such that the electron beam 110 decelerates to 1 keV as it approaches the substrate 105.

Exposure rate refers to the area of the pattern exposed on the substrate 105 per unit time, and determines the speed of pattern generation. A first factor affecting exposure rate is the total beam current used to pattern the substrate 105. The total beam current is equal to the number of electron beams $N_b$ multiplied by the current $I_b$ delivered by each electron beam 110. The exposure rate 'R' ($cm^2$/sec) of a system is typically equal to the total beam current 'I' (Amps) divided by the resist sensitivity 'S' ($C/cm^2$). Thus, the time T to expose a given area is approximately $AS/N_bI_b$, where A is the area to be patterned. High exposure rates can be achieved by using a sufficiently large number of electron beams 110 and a sufficiently large current in each electron beam 110. However, the retarded electron beams 110 described above can expose more area in a given amount of time since the resist sensitivity S is approximately proportional to the energy of the electron beams 110. Therefore, the total beam current can be decreased while maintaining exposure rate, the advantage being improved resolution. Or, alternatively, exposure rate can be increased while maintaining total beam current at a given resolution. The improved performance allows the use of confined brush optics having one or more crossovers. This substantially increases the operating range of the optics and extends the system performance. Another benefit of the retarding potential configuration is that, due to the low landing energy $E_L$, proximity effects from electron scattering are eliminated or greatly reduced. The reduced landing energy also reduces the incident exposure power, which in turn reduces deleterious heating effects within the substrate 105.

A multiple electron beam pattern generator 100 that uses a plurality of electron beams 110 to generate a pattern on a substrate 105 can consequently operate with better resolution, with better dimensional control, and at higher exposure rates than single electron beam pattern generators. First, the total current $I=N_b \times I_b$ is divided into a plurality of beams 110 $N_b$. The spatial separation of the beams 110 helps reduce the space charge interactions within the optics as well as heating effects on the substrate 105. Both factors improve print resolution. The extended spatial extent of the beams 110 also can allow a lower substrate support velocity as the effective field of view is increased, as well as reduce the slew rate of the electronics used to scan the beam array 155.

There are other system benefits to using multiple electron beam optics having a single deflection system. The confined brush of the multiple electron beam array can be driven by a raster bitmapped datapath having the capability of handling large pattern files as input to the system. The use of a confined brush array can simplify the calibration of their position and dosage. This multiple electron beam pattern generator 100 can thereby exceed the resolution of conventional pattern generators. Further benefits of the confined brush configuration include maintaining efficient calibration as the number of beams 110 is increased, substrate support yaw, pitch, and roll errors that have an impact on pattern positional accuracy can be greatly reduced compared to extended exposure strategies that have highly separated distances between individual beams 110.

The total beam current can be reduced by one or two orders of magnitude, such as a reduction of about 50 times, in comparison to a conventional electron beam pattern generator that does not retard the electron beams 110 while maintaining a good exposure throughput. Space charge interactions between the electron beams 110 are reduced because of these significantly lower beam currents. This improvement may even yield higher throughputs than certain conventional pattern generators, such as throughputs of, for example, at least about 1 wafer per hour for wafers having a diameter of about 300 mm. Moreover, a lower power laser beam generator 130 can be used to generate the lower current electron beams 110.

Pixel delivery data rate and optical field of view are other system factors that can be taken into account to meet desired exposure rates. Multiple electron beam patterning permits the use of slower data clocks since the pixel exposure rate is the product of the number of electron beams 110 and the data clock rate. The extended field of the electron beams 110 effectively increases the field of view and thereby reduces the corresponding substrate support velocity for a given exposure rate.

In one embodiment, the potential decreasing element 315 and retarding voltage supply 335 are provided in a beam retarding modification kit for a conventional electron beam pattern generator. For example, the retarding electrode 320 can be installed in a conventional electron beam pattern generator to add the capability of retarding multiple electron beams 110. Additionally or alternatively, the substrate support can be modified to include the potential decreasing element 315, or the conventional substrate support can be replaced with an upgraded substrate support 305 that includes the potential decreasing element 315. For example, a retarding electrode 330 provided in the beam retarding modification kit may be embedded in the conventional substrate support and connected to the retarding voltage supply 335 to upgrade the substrate support. Additionally, the substrate support can be modified to electrically isolate the substrate 105 from other parts of the multiple electron beam pattern generator 100, such as the vacuum column 225. The beam retarding modification kit provides an efficient and cost-effective alternative to replacement of the entire conventional electron beam pattern generator with an improved multiple electron beam pattern generator 100 having the multiple beam retarding capability described herein.

Returning to FIG. 1, the multiple electron beam pattern generator 100 may further comprise a fiducial mark locator 340 capable of locating fiducial marks (not shown) on the substrate 105. The fiducial marks may be used as reference points of the substrate 105. For example, the fiducial marks of the substrate 105 may be useful for preemptively correcting the pattern to be generated on the substrate 105. Fiducial marks may move relative to their intended locations during processing of the substrate 105. The degree of movement or misalignment of the fiducial marks may vary at different regions of the substrate 105 depending upon the localized stresses or distortions of the substrate 105, or the apparatus that placed the fiducial mark.

The multiple electron beam pattern generator 100 further comprises a controller 400 comprising a suitable configuration of hardware and software to operate the components of the multiple electron beam pattern generator 100 to generate a pattern on the substrate 105. An exemplary controller 400 is illustrated in FIG. 1. For example, the controller 400 may comprise a central processing unit (CPU) 405 that is connected to a memory 410 and other components. The CPU 405 comprises a microprocessor, such as a complex instruction set computer (CISC) microprocessor, for example a Pentium (™) microprocessor commercially available from Intel Corporation, Santa Clara, Calif., or a reduced instruction set computer (RISC) microprocessor, capable of executing a computer-readable program 415. The memory 410 may comprise a computer-readable medium such as hard disks 420 in a redundant array of independent disks (RAID) configuration, removable storage 425 such as an optical compact disc (CD) or floppy disk, random access memory (RAM) 430, and/or other types of volatile or non-volatile memory. The interface between a human operator and the controller 400 can be, for example, via a display 435, such as a flat panel display or cathode ray tube (CRT) monitor, and an input device, such as a keyboard 440. The controller 400 may also include drive electronics 445 such as analog and digital input/output boards, linear motor driver boards, or stepper motor controller boards.

Figure 5:
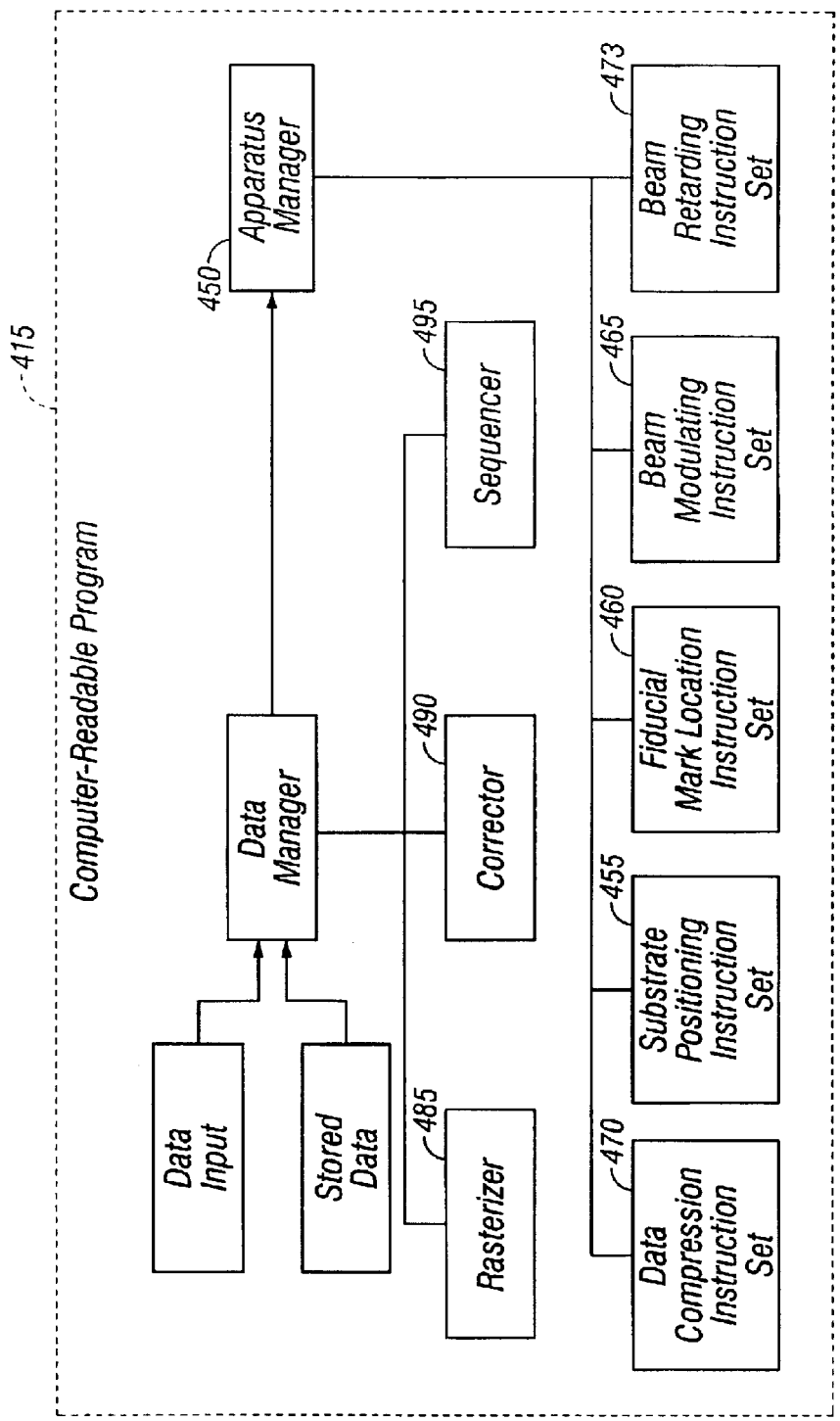
FIG. 5 is a schematic diagram of an embodiment of a computer-readable program executed by the controller of FIG. 1.

The computer-readable program 415, as shown in FIG. 5, generally comprises software comprising sets of instructions to operate the apparatus components, and an apparatus manager 450 to manage the instruction sets. The computer-readable program 415 can be written in any conventional programming language, such as for example, assembly language, C, C++ or Pascal. Suitable program code is entered into a single file, or multiple files, using a conventional text editor and stored or embodied in the memory 410 of the controller 400. If the entered code text is in a high level language, the code is compiled, and the resultant compiler code is then linked with an object code of pre-compiled library routines. To execute the linked, compiled object code, the user invokes the feature code, causing the CPU 405 to read and execute the code to perform the tasks identified in the computer-readable program 415. Using a keyboard interface, a human user enters commands or registration parameters into the computer-readable program 415 in response to menus or screens displayed on the display 435. The computer-readable program 415 may include instruction sets to, for example, control the positioning of the substrate support 305 (instruction set 455), locate the fiducial marks (instruction set 460), control beam modulation (instruction set 465), control data compression (instruction set 470), and control the retarding of the electron beams 110 (instruction set 473). The instruction sets may receive parameters, such as a data file corresponding to the support position, the fiducial mark locations, the pattern, or instructions entered by the human operator.

The controller 400 is adapted to generate, send, and receive signals to operate the apparatus components to generate a pattern on the substrate 105 using electron beams 110. For example, the controller 400 may send signals to the beam modulator 135 to control modulation of the electron beams 110 to the desired intensity levels and in correspondence to the electron beam pattern data. The beam modulator 135 may also be controlled to scale the pattern in the scanning direction by timing the beam pulses, and the support motors may also receive real-time instructions from the controller 400 to control the position of the substrate 105 to scale, rotate, or offset the pattern generated by the electron beams 110 on the substrate 105. As another example, the controller 400 may also operate the fiducial mark locator 340 by receiving measured locations of the fiducial marks and comparing them to their intended locations to determine the deviation of each fiducial mark.

Figure 6:
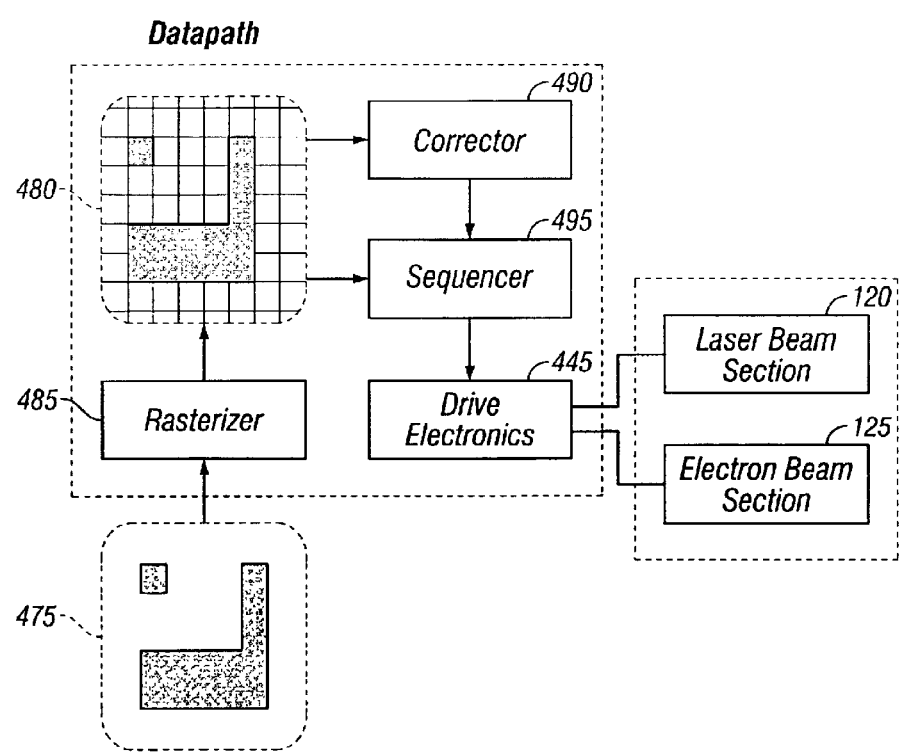
FIG. 6 is a block diagram of an embodiment of a data path for generating a raster scanning data pattern.

The controller 400 may control the beam modulator 135 and beam scanner 295 of the multiple electron beam pattern generator 100 to scan the electron beams 110 across the substrate 105 according to a raster method, or alternatively, according to a vector method. Depending on the scanning method used, the pattern data that are stored in the memory 410 and communicated to the beam modulator 135 are also different. FIG. 6 is a block diagram showing a data processing path for a raster scanned electron pattern. In a raster method, the pattern data 475 are processed into a bitmap 480 by a rasterizer 485 and the bitmap 480 is stored in the memory 410. An exemplary rasterizer 485 is described in commonly-assigned U.S. Pat. No. 5,533,170 by Teitzel et al., titled "Rasterizer for a Pattern Generation Apparatus," filed on Nov. 22, 1994, which is hereby incorporated by reference in its entirety. Thereafter, a corrector 490 corrects the bitmap to compensate for proximity exposure effects by making changes in dosage. A sequencer 495 then sequences the bitmap to sequentially apply the bitmap data to the modulation of the individual electron beams 110. Control of pixel dosage is determined by the modulation of the electron beams 110 as a function of time. The electron beams 110 are scanned across the substrate 105 in coordination with the translation of the substrate support 305, and in a substantially predetermined sequence of parallel scan lines to generate the pattern on the substrate 105.

In a vector scanning method, in contrast, the pattern data are stored as vectors. For example, data corresponding to a line can be stored as a vector comprising a starting position, a length, and a direction. Additionally, certain other shapes may be stored in a way that refers to the characteristic dimensions of the shapes. The electron beams 110 are scanned across the substrate 105 along paths that correspond to the pattern vectors. For example, to draw a line, the beam scanner 295 could deflect an electron beam 110 to the starting position in a first step, the beam modulator 135 turns on the electron beam 110 in a second step, the beam scanner 295 deflects the turned-on electron beam 110 through the length of the line in a third step, and the beam modulator 135 turns off the electron beam 110 in a fourth step.

Figure 7:
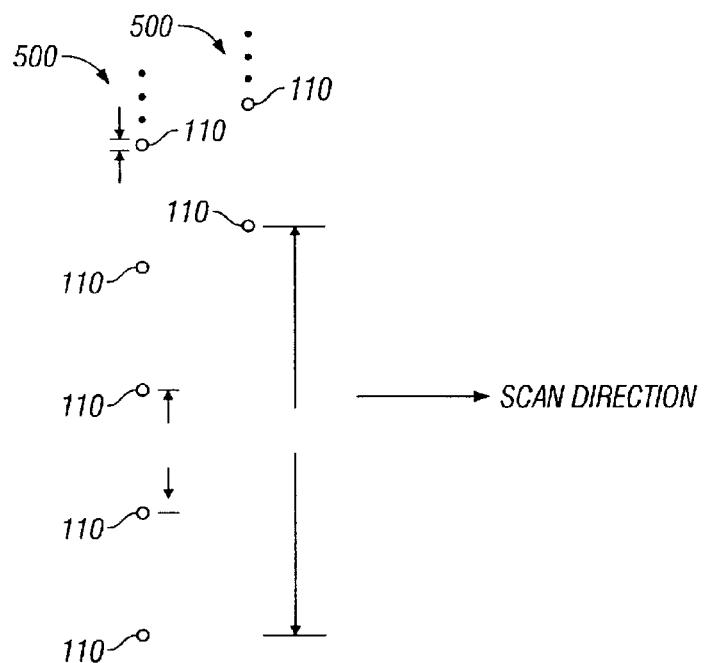
FIG. 7 is a schematic top view of a brush of electron beams.
Figure 8:
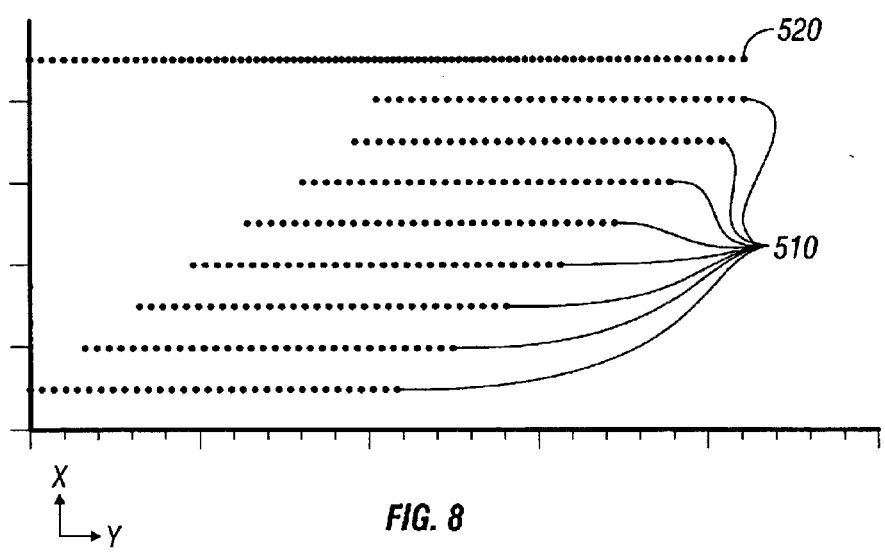
FIG. 8 is a top view of time lapsed brushes of electron beams being raster scanned across a substrate.

The electron beams 110 are spatially distributed such that interference and other crosstalk between them are reduced or eliminated. However, a final exposed pattern in the resist layer 115 produced by raster scanning is typically composed of overlapping spots, which can be accomplished by employing an interlaced scan pattern print strategy and writing with multiple passes. FIGS. 7 and 8 illustrate an embodiment of such an interlaced raster scanning method. Shown in FIG. 7 is a portion of the leading edge of an electron beam brush 500. More particularly, the first five (5) beams 110 of the brush 500 are shown for clarity. The electron beam brush 500 is scanned in the direction perpendicular to the alignment of the brush 500. By the next scan, the substrate support 305 has moved in the direction of the alignment of the electron beams 110 in the brush 500. In FIG. 8 are shown a plurality of offset brush lines 510 and a single continuous line 520 resulting from the interlacing of the offset brush lines 510. The offset brush lines 510 fill in the continuous line in the 'y' direction while forming lines in the 'x' direction.

The controller 400 may contain pattern data in the memory 410 in either flat or hierarchical formats. The flat formats contain the pattern information in a raw form that is not organized by hierarchy or otherwise compressed. For example, the flat formats may comprise MEBES modes 3, 4, or 5. In contrast, the hierarchical formats contain the pattern information in a compressed hierarchical organization that expedites storage transmission from the memory 410 to the beam modulator 135. For example, the hierarchical formats may comprise GDS II (a trademark of Calma Corporation, Santa Clara, Calif.).

Although the present invention has been described in considerable detail with regard to certain preferred versions thereof, other versions are possible. The present invention could be used with other multiple electron beam pattern generators 100 or other equivalent configurations as would be apparent to one of ordinary skill in the art. For example, the multiple electron beam pattern generator 100 may generate a pattern on a substrate 105 using electron beams 110 that are generated and modulated directly by an electron source and that does not use the laser beam section 120. Thus, the appended claims should not be limited to the description of the preferred versions contained herein.

What is claimed is:

1. A multiple electron beam pattern generator comprising:
   (a) a multiple electron beam source to generate a plurality of electron beams that are modulated according to a pattern;
   (b) an anode to accelerate the electron beams;
   (c) beam optics to focus the electron beams;
   (d) a beam retarding system to generate a retarding electric potential about the electron beams to decrease the kinetic energy of the electron beams substantially near a substrate, the beam retarding system comprising a retarding electrode to receive the retarding potential and having an aperture through which the electron beams pass;
   (e) a beam scanner to scan the electron beams across the substrate; and
   (f) a substrate support to support the substrate, whereby the pattern is generated on the substrate.

2. A pattern generator according to claim 1 wherein the beam retarding system comprises:
   (i) a voltage supply to generate the retarding potential; and
   (ii) an electrical connector to connect the voltage supply to the substrate on the substrate support.

3. A pattern generator according to claim 1 wherein the beam retarding system comprises:
   (i) a voltage supply to generate the retarding potential; and
   (ii) an electrical connector to connect the voltage supply to the retarding electrode.

4. A pattern generator according to claim 1 wherein the multiple electron beam source, anode, and beam retarding system are adapted to provide electric potentials about the electron beams of about $-V_B$, $V_A$, and $-V_B+V_L$, respectively, where $V_L$ is from about 0.1 kV to about 5 kV.

5. A pattern generator according to claim 1 wherein the multiple electron beam source, anode, and beam retarding system are adapted to provide electric potentials about the electron beams of about $-V_B$, $V_A$, and $-V_B+V_L$, respectively, where the ratio of $V_B$ to $V_L$ is from about 10 to about 100.

6. A pattern generator according to claim 1 further comprising electron optics to converge the electron beams to at least one crossover region.

7. A pattern generator according to claim 1 wherein the multiple electron beam source comprises a laser source to generate a laser beam, a diffractive optical element to split the laser beam into a plurality of laser beams, an array of acousto-optic modulators to modulate the laser beams, and a photocathode to generate electron beams corresponding to the modulated laser beams.

8. A pattern generator according to claim 1 wherein the multiple electron beam source comprises a laser source, an array of spatial light modulators to modulate a plurality of laser beams, and a photocathode to generate electron beams corresponding to the modulated laser beams.

9. A pattern generator according to claim 1 wherein the multiple electron beam source comprises (i) an electron gun to generate electrons and (ii) an aperture array comprising electrodes about apertures, the electrodes being adapted to draw electron beams from the electron gun and individually modulate a passage of each electron beam.

10. A multiple electron beam pattern generator comprising:
    (a) a multiple electron beam source to generate a plurality of electron beams that are modulated according to a pattern and directed along a path, the multiple electron beam source adapted to provide a first electric potential about the plurality of electron beams of about $-V_B$;
    (b) a substrate support to support a substrate;
    (c) an anode;
    (d) an anode voltage supply to apply a second electric potential to the anode to accelerate the electron beams, the second electric potential having a value of about $V_A$;
    (e) beam optics to focus the electron beams;
    (f) a retarding electrode between the anode and the substrate support along the path of the electron beams;
    (g) a retarding voltage supply to apply a third electric potential to the retarding electrode, the third electric potential being lower than the second electric potential and having a value of about $-V_B+V_L$ wherein the ratio of $V_B$ to $V_L$ is from about 10 to about 100;
    (h) a beam scanner to scan the electron beams across the substrate,
    whereby the pattern is generated on the substrate.

11. A pattern generator according to claim 10 wherein the retarding electrode has an aperture to allow the electron beams to pass.

12. A pattern generator according to claim 10 wherein the multiple electron beam source, anode, and retarding electrode are adapted to provide electric potentials about the electron beams of about $-V_B$, $V_A$, and $-V_B+V_L$, respectively, where $V_L$ is from about 0.1 kV to about 5 kV.

13. A pattern generator according to claim 10 wherein $-V_B$ is about $-50$ kV, $V_A$ is about 0 V, and $-V_B+V_L$ is about $-49$ kV.

14. A multiple electron beam pattern generator comprising:
    (a) a multiple electron beam source to generate a plurality of electron beams that are modulated according to a grayscale intensity pattern;
    (b) an anode to accelerate the electron beams;
    (c) beam optics to focus the electron beams;
    (d) a beam retarding system to retard the electron beams from a kinetic energy in the range of from about 10 keV to about 100 keV to a kinetic energy in the range of from about 100 eV to about 5 keV substantially near a substrate;
    (e) a beam scanner to scan the electron beams across the substrate in an interlaced scan pattern; and
    (f) a substrate support to support and electrically isolate the substrate, and to transport the substrate in coordination with the scanning of the electron beams by the beam scanner, whereby the pattern is generated on the substrate.

15. A pattern generator according to claim 14 wherein the multiple electron beam source, anode, and beam retarding system are adapted to provide electric potentials about the electron beams of about $-V_B$, $V_A$, and $-V_B+V_L$, respectively, where the ratio of $V_B$ to $V_L$ is from about 10 to about 100.

16. A method of generating a pattern on a substrate, the method comprising:
    (a) generating a plurality of electron beams that are modulated according to a pattern;
    (b) accelerating the electron beams to a kinetic energy in the range of from about 10 keV to about 100 keV;
    (c) focusing the electron beams;
    (d) maintaining a retarding electric potential about the electron beams to decrease the kinetic energy of the electron beams substantially near a substrate to a kinetic energy in the range of about 100 eV to about 5 keV; and
    (e) scanning the electron beams across the substrate, whereby the pattern is generated on the substrate.

17. A method according to claim 16 wherein (d) comprises applying a retarding electric potential to the substrate.

18. A method according to claim 16 wherein (d) comprises maintaining the retarding electric potential in a region immediately above the substrate.

19. A method according to claim 16 wherein (d) comprises maintaining electric potentials about successive regions of a pathway traversed by the electron beams of about $-V_B$, $V_A$, and $-V_B+V_L$, where $V_L$ is from about 0.1 kV to about 5 kV.

20. A method according to claim 16 wherein (d) comprises maintaining electric potentials about successive regions of a pathway traversed by the electron beams of about $-V_B$, $V_A$, and $-V_B+V_L$, where the ratio of $V_B$ to $V_L$ is from about 10 to about 100.

21. A method according to claim 16 wherein (e) comprises scanning the electron beams across a substrate having a resist layer comprising a top imaging layer with a thickness of from about 20 to about 150 nm.

22. A method according to claim 16 further comprising converging the electron beams to at least one crossover region.

23. A beam retarding modification kit for a multiple electron beam pattern generator, the multiple electron beam pattern generator comprising a multiple electron beam source to generate a plurality of electron beams, an anode to accelerate the electron beams, electron beam optics to focus the electron beams, a beam scanner to scan the electron beams across the substrate to generate a pattern on the substrate, and a substrate support to support a substrate, the kit comprising:
    (a) a potential decreasing element placed about the substrate support, the potential decreasing element comprising a retarding electrode having an aperture sized to allow the electron beams to pass through; and
    (b) a voltage supply to apply a voltage to the potential decreasing element to generate a retarding electric field about the electron beams to decrease the kinetic energy of the electron beams substantially near the substrate.

24. A kit according to claim 23 wherein the potential decreasing element comprises a second retarding electrode positioned in the substrate support, the second retarding electrode comprising a conductive pin that passes through a portion of the substrate support and contacts the substrate.

25. A kit according to claim 23 wherein the potential decreasing element comprises an electrical connector to contact the substrate support.

26. A multiple electron beam pattern generator comprising:
- (a) a multiple electron beam source to generate a plurality of electron beams that are modulated according to a pattern and directed along a path;
- (b) a substrate support to support a substrate;
- (c) an anode;
- (d) an anode voltage supply to apply a first electric potential to the anode to accelerate the electron beams;
- (e) beam optics to focus the electron beams;
- (f) a plurality of retarding electrodes located between the anode and the substrate support along the path of the electron beams;
- (h) a retarding voltage supply to apply a plurality of electric potentials $Vr_i$ to the plurality of retarding electrodes, the plurality of electric potentials $Vr_i$ having successively lower values such that an overall potential drop over the plurality of retarding electrodes is subdivided among the plurality of retarding electrodes; and
- (i) a beam scanner to scan the electron beams across the substrate, whereby the pattern is generated on the substrate.

27. A pattern generator according to claim 26 comprising a potential decreasing element in the substrate support.

28. A pattern generator according to claim 26 wherein the overall potential drop over the plurality of retarding electrodes is subdivided among the plurality of retarding electrodes symmetrically.

* * * * *